(12) United States Patent
Gardner et al.

(10) Patent No.: US 7,637,658 B2
(45) Date of Patent: Dec. 29, 2009

(54) SYSTEMS AND METHODS FOR PWM CLOCKING IN A TEMPERATURE MEASUREMENT CIRCUIT

(75) Inventors: Marco A. Gardner, Tucson, AZ (US); Jerry L. Doorenbos, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 260 days.

(21) Appl. No.: 11/738,571

(22) Filed: Apr. 23, 2007

(65) Prior Publication Data

US 2008/0259997 A1   Oct. 23, 2008

(51) Int. Cl.
G01K 7/00 (2006.01)
(52) U.S. Cl. .................... 374/178; 374/170; 327/512
(58) Field of Classification Search ............... 374/170, 374/178; 327/512
See application file for complete search history.

(56) References Cited

U.S. PATENT DOCUMENTS

| | | | |
|---|---|---|---|
| 4,165,642 A * | 8/1979 | Lipp ........................... | 374/170 |
| 5,195,827 A | 3/1993 | Audy | |
| 5,867,012 A | 2/1999 | Tuthill | |
| 5,982,221 A | 11/1999 | Tuthill | |
| 6,097,239 A | 8/2000 | Miranda, Jr. et al. | |
| 6,133,753 A | 10/2000 | Thomson et al. | |
| 6,169,442 B1 | 1/2001 | Meehan et al. | |
| 6,407,618 B1 * | 6/2002 | Taft et al. .................... | 327/534 |
| 7,193,543 B1 * | 3/2007 | McLeod et al. ............. | 341/123 |
| 2007/0091979 A1 * | 4/2007 | Chiu ............................. | 374/1 |

OTHER PUBLICATIONS

Analog Devices Data Sheet, 10-Bit Temperature Sensor (AD7416) and Four Single ADCs (AD7417/AD7418), 2004, printed from www.analog.com Apr. 10, 2007.

Analog Devices Data Sheet TMP401, Low Power Programmable Temperature Controller, 2002, printed from www.analog.com Apr. 10, 2007.

Texas Instruments Data Sheet TMP401, +/-1C Programmable Remote/Local Digital Out Temperature Sensor, Aug. 2006, printed from www.ti.com Apr. 10, 2007.

Doorenbos et al., Texas Instruments Data Sheet TMP411, +/-1C Remote and Local Temperature Sensor with N-Factor and Series Resistance Correction, Feb. 2007.

SMSC Data Sheet, EMC1023 1C Triple Temperature Sensor with Resistance Error Correction, Dec. 3, 2004.

U.S. Appl. No. 11/738,566, filed Apr. 23, 2007, Doorenbos et al.
U.S. Appl. No. 11/738,584, filed Apr. 23, 2007, Gardner et al.
U.S. Appl. No. 11/738,595, Apr. 23, 2007. Doorenbos et al.

Analog Devices Data Sheet, +/- 1 C Remote and Local System Temperature Monitor (ADM1032), 2005, printed from analog.com, May 24, 2007.

(Continued)

*Primary Examiner*—Gail Verbitsky
*Assistant Examiner*—Mirellys Jagan
(74) *Attorney, Agent, or Firm*—John J. Patti; Wade J. Brady, III; Frederick J. Telecky, Jr.

(57) ABSTRACT

Various systems and methods for pulse width modulated clocking in a temperature measurement are disclosed. For example, some embodiments of the present invention provide temperature measurement systems with a variable current source, a transistor, and a pulse width modulation circuit. The variable current source is operable to provide a first current and a second current that are applied to the transistor. A first base-emitter voltage occurs on the transistor when the first current is applied, and a second base-emitter voltage occurs on the transistor when the second current is applied. The first base emitter voltage is associated with a first sample period, and a second base-emitter voltage is associated with a second sample period. The pulse width modulation circuit provides a pulse width modulated clock including a combination of the aforementioned first period and second period.

19 Claims, 3 Drawing Sheets

OTHER PUBLICATIONS

Analog Devices Data Sheet, +/− C Temperature Monitor with Series Resistance Cancellation (ADT7461), 2005, printed from analog.com, May 24, 2007.

Maxim Data Sheet, Remote/Local Temperature Sensor with SMBus Serial Interface, (MAX1617A), Jan. 1999, printed from www.maxim-ic.com, May 24, 2007.

Pertijs et al. "A Cmos Smart Temperature Sensor" IEEE J. Solid-State Circuits, vol. 40, No. 12, Dec. 2005.

SMSC Data Sheet 1 Degree D Triple SMbus Sensor with Resistance Error Correction, (EMC1033), Jan. 2007, printed from www.smsc.com.

* cited by examiner

SYSTEMS AND METHODS FOR PWM CLOCKING IN A TEMPERATURE MEASUREMENT CIRCUIT

BACKGROUND OF THE INVENTION

The present invention is related to temperature measurement, and more particularly to temperature measurements using a transistor or diode as a sensor.

Temperature measurement using a transistor as a sensor is a common application in the semiconductor area. Such a temperature measurement is done by applying two different currents to the transistor each resulting in a respective base-emitter voltage. The difference between the two base-emitter voltages is proportional the absolute temperature of the transistor. To assure an accurate base-emitter voltage measurement, a settling period after application of an excitation current is required before sampling the corresponding base-emitter voltage. This settling time depends upon the magnitude of the applied excitation current and any filter capacitance and series resistance in the circuit. Thus, the settling time will typically be different for each applied excitation current.

Turning to FIG. 1a, a simplified prior art temperature measurement system 100 is depicted. Temperature measurement system 100 includes a temperature calculation system 140 that is electrically coupled to the base and emitter of a transistor 144. Transistor 144 is electrically coupled to a variable current source 142 that allows for exciting transistor 144 using two different currents. Temperature calculation system 140 measures the base-emitter voltage of transistor 144 corresponding to the two different current excitations applied via variable current source 142. As previously noted, the difference between the two different base-emitter voltages is proportional to the absolute temperature of transistor 144. The following equation defines the relationship between the difference between base-emitter voltage measurements and absolute temperature:

$$\Delta V_{be} = V_{be2} - V_{be1} = n^* kT/q^* \ln(I_2/I_1).$$

The 'n' term is known as the non-ideality factor or emission coefficient is assumed to be a constant (n=1.008) for diodes and transistors.

Temperature measurement system 100 is clocked by an oscillator 110 which has its output divided by a divider circuit 120. The output of divider circuit 120 is a clock 190 that is used to synchronize the operation of temperature measurement system 100 and in some cases other circuitry associated therewith. Various periods such as, for examples sampling periods required to sample and/or process base-emitter voltages from transistor 144 are governed by one or more period counters 130 as are known in the art.

As shown in a timing diagram 155 of FIG. 1b, a sample period 150 is paced by the slowest settling time associated with an applied excitation current. In operation, sample periods 150 each include the same predetermined number of cycles of clock 190 as counted by period counter 130, with the number of cycles being selected to match the slowest settling time. Each sample period 150 is used to sample a base-emitter voltage corresponding to a different excitation current applied by variable current source 142. Each time a different excitation current is applied to transistor 144, a delay period must be awaited to assure that the base-emitter voltage of transistor 144 to be sampled is stable. As shown, a required sample period 180 corresponds to one excitation current offering the slowest settling time, and thus utilizes the entire sample period 150b. In contrast, a required sample period 160 associated with a faster settling time utilizes only a portion of sample period 150a. In this case, the remaining portion of sample period 150a is a wasted period 170. Where, for example, wasted period 170 is the same length as required sample period 160, a twenty-five percent bandwidth overhead is incurred. The aforementioned bandwidth overhead results in a number of unused cycles of clock 190 propagating through various circuitry including temperature calculation system 140, and the corresponding unnecessary power dissipation associated therewith.

Thus, for at least the aforementioned reasons, there exists a need in the art for advanced systems and devices for temperature measurement.

BRIEF SUMMARY OF THE INVENTION

The present invention is related to temperature measurement, and more particularly to temperature measurements using a transistor or diode as a sensor.

Various embodiments of the present invention provide temperature measurement systems. Such temperature measurement systems include a variable current source, a transistor, and a pulse width modulation circuit. The variable current source is operable to provide a first current and a second current that are applied to the transistor. A first base-emitter voltage is exhibited by the transistor when the first current is applied, and a second base-emitter voltage is exhibited by the transistor when the second current is applied. The first base emitter voltage is associated with a first sample period, and a second base-emitter voltage is associated with a second sample period. The pulse width modulation circuit provides a pulse width modulated clock including a combination of periods corresponding to the aforementioned first sample period and second sample period.

In some instances of the aforementioned embodiments, the pulse width modulated clock includes a repeating pattern of a first clock cycle succeeded by a second clock cycle, and the second clock cycle succeeded by the first clock cycle. In such cases, the first clock cycle may exhibit the first period and the second clock cycle may exhibit the second period. In various instances of the aforementioned embodiments, the variable current source is further operable to provide a third current and a fourth current. A third base-emitter voltage occurs when the third current is applied to the transistor and a fourth base-emitter voltage occurs when the fourth current is applied to the transistor. A third sample period is associated with the third base-emitter voltage, and a fourth sample period is associated with the fourth base-emitter voltage. In such instances, the pulse width modulation circuit provides the pulse width modulated clock with a first period associated with the first sample period, a second period associated with the second sample period, a third period associated with the third sample period, and a fourth period associated with the fourth sample period. In some cases, the pulse width modulated clock includes a repeating pattern of a first clock cycle succeeded by a second clock cycle, the second clock cycle succeeded by a third clock cycle, the third clock cycle succeeded by a fourth clock cycle, and the fourth clock cycle succeeded by the first clock cycle. In such cases, the first clock cycle exhibits the first period, the second clock cycle exhibits the second period, the third clock cycle exhibits the third period, and the fourth clock cycle exhibits the fourth period. In one or more instances of the aforementioned embodiments, the sampling periods correspond to a settling time of a respective base-emitter voltage after application of the corresponding excitation current by the variable current source.

In some instances of the aforementioned embodiments, the temperature measurement system further includes an analog to digital converter. In such instances, the analog to digital converter is operable to receive the first base-emitter voltage and the second base-emitter voltage, and to provide a delta base-emitter voltage based at least in part on the first base-emitter voltage and the second base-emitter voltage. The analog to digital converter may include a result counter that is operable to tabulate a delta base-emitter voltage value, and is synchronized to the pulse width modulated clock. In some cases, the analog to digital converter includes a sample counter that governs the number of samples processed by the analog to digital converter, and is synchronized to the pulse width modulated clock. In various cases, the temperature measurement system includes a temperature calculation circuit that is synchronized to the pulse width modulated clock, and provides a temperature output based at least in part on the delta base-emitter voltage. In some instances of the aforementioned embodiments, the temperature measurement system is associated with other digital circuitry performing a number of different functions. In such instances, some or all of the other digital circuitry is synchronized to the pulse width modulated clock.

Other embodiments of the present invention provide methods for temperature measurement. Such methods include providing a temperature circuit that has, among other things, a variable current source, a transistor, and an analog to digital converter. The variable current source is electrically coupled to the transistor, and the analog to digital converter is operable to sample a base-emitter voltage associated with the transistor. The methods further include applying a first current to the transistor via the variable current source such that a first base-emitter voltage occurs on the transistor, and subsequently applying a second current to the transistor via the variable current source such that a second base-emitter voltage occurs on the transistor. A pulse width modulated clock is provided. The pulse width modulated clock includes a first period corresponding to a sampling period of the first base-emitter voltage, and a second period corresponding to a sampling period of the second base-emitter voltage.

Yet other embodiments of the present invention provide analog to digital converter circuits. Such analog to digital converter circuits include a first sampling input and a second sampling input. Each of the aforementioned sampling inputs are associated with a respective sampling period. The analog to digital converter circuits further include a sample and integration circuit that receives the first sample input and the second sample input in an alternating pattern, and provides a converted output. The analog to digital circuits further include a pulse width modulation circuit that provides a pulse width modulated clock with a first period associated with the first sample period and a second period associated with the second sample period. In some instances of the aforementioned embodiments, the analog to digital converter further includes a transistor and a variable current source that is operable to provide a first current and a second current. In such instances, the first sample input is a first base emitter voltage associated with the first current, and the second sample input is a second base-emitter voltage associated with the second current.

This summary provides only a general outline of some embodiments according to the present invention. Many other objects, features, advantages and other embodiments of the present invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several drawings to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

The present invention is related to temperature measurement, and more particularly to temperature measurements using a transistor or diode as a sensor.

Various embodiments of the present invention provide temperature measurement methods and systems. Such temperature measurement systems may include a variable current source, a transistor, and a pulse width modulation circuit. The variable current source is operable to apply two or more excitation currents to the transistor. A first base-emitter voltage is exhibited by the transistor when the one of the excitation currents is applied, and a second base-emitter voltage is exhibited by the transistor when another excitation current is applied. The first base emitter voltage is associated with a first sample period, and a second base-emitter voltage is associated with a second sample period. The pulse width modulation circuit provides a pulse width modulated clock including a combination of periods corresponding to the aforementioned first sample period and second sample period. In some such cases, the aforementioned "sampling periods" correspond to a settling time associated with a particular base-emitter voltage excitation. As used herein, the phrase "settling time" is used in its broadest sense to mean any period of sufficient duration to allow a base-emitter voltage to stabilize to the extent that a sample of desired accuracy may be achieved.

In some instances of the aforementioned embodiments, the pulse width modulated clock includes a repeating pattern of a first clock cycle succeeded by a second clock cycle, and the second clock cycle succeeded by the first clock cycle. In such cases, the first clock cycle may exhibit the first period and the second clock cycle may exhibit the second period. In other cases, the repeating pattern includes more than the first and second clock cycles. Thus, while pulse width modulated clocks including two and four distinct clock cycles are explicitly discussed herein, based on the disclosure provided herein, one of ordinary skill in the art will recognize approaches and implementations of embodiments of the present invention where two or more distinct clock cycles are repeated to create a desired pulse width modulated clock.

Figure 1A:
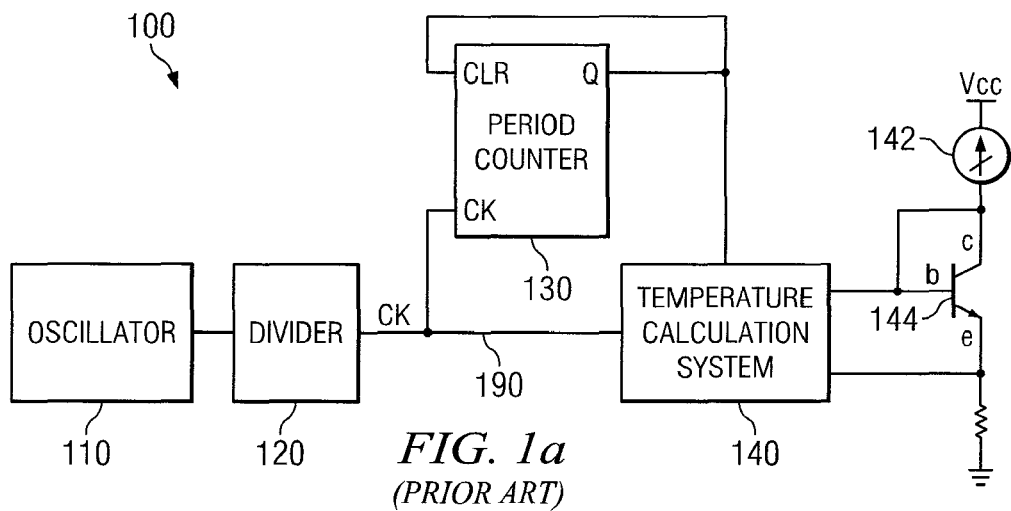
FIG. 1a depicts a simplified temperature measurement system including a prior art oscillator based clocking scheme.
Figure 1B:
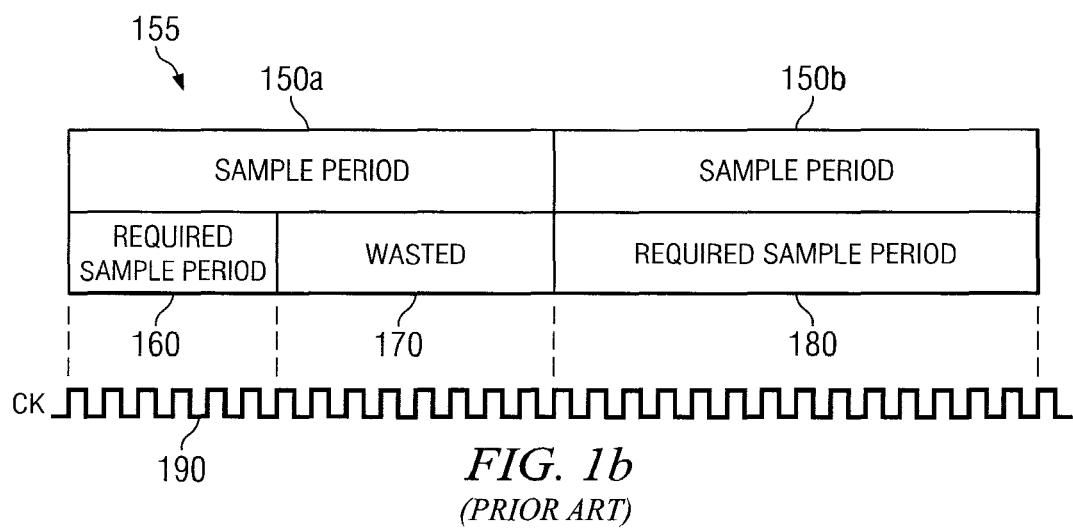
FIG. 1b shows a timing diagram associated with the temperature measurement system of FIG. 1a where a stable oscillator driven clock is used.
Figure 2:
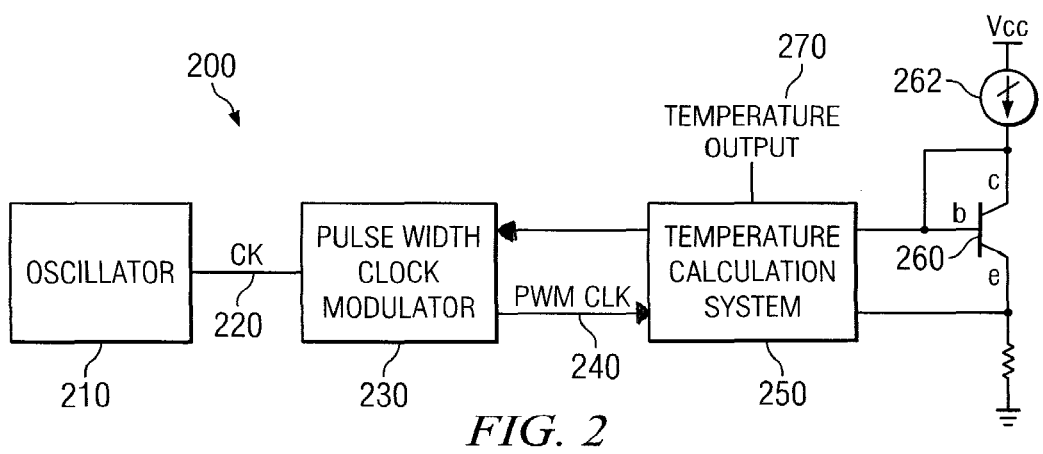
FIG. 2 is a temperature measurement system in accordance with one or more embodiments of the present invention including a pulse width modulated clock.

Turning to FIG. 2, a temperature measurement system 200 including a pulse width modulated clock is depicted in accordance with one or more embodiments of the present invention. Temperature measurement system 200 includes a temperature calculation system 250 that is electrically coupled to the base and emitter of a transistor 260. Transistor 260 is electrically coupled to a variable current source 262 that allows for exciting transistor 260 using two or more different currents. Temperature calculation system 250 measures the base-emitter voltage of transistor 260 corresponding to different current excitations applied via variable current source 262.

The difference between the measured base-emitter voltages is proportional to the absolute temperature of transistor 260. The following equation defines the relationship between the difference between base-emitter voltage measurements and absolute temperature:

$$\Delta V_{be} = V_{be2} - V_{be1} = n*kT/q*ln(I_2/I_1).$$

The 'n' term is known as the non-ideality factor or emission coefficient is assumed to be a constant (n=1.008) for diodes and transistors. The calculated temperature is provided as a temperature output 270 from temperature calculation system 250. As used herein, the phrase "delta base-emitter voltage" is used in its broadest sense to mean a difference between two or more base-emitter voltages.

In contrast to prior temperature measurement systems, temperature calculation system 250 is clocked using a pulse width modulated clock 240 with a series of repeating periods that each may be tailored to the length of sampling period required for various different excitation currents. In this way, the clock used to synchronize temperature calculation system 250 and other surrounding circuitry is not burdened with unnecessary clock cycles. This results in a reduction of power dissipated by temperature measurement system 200 relative to prior temperature measurement systems. Further, this results in an overall reduction in the time spent sampling. This time savings can be very significant in situations where a number of samples are taken before a temperature result is provided. Yet further, the reduced clocking frequency may limit system noise making sensitive measurements less susceptible to errors due to interference or noise.

Figure 3:
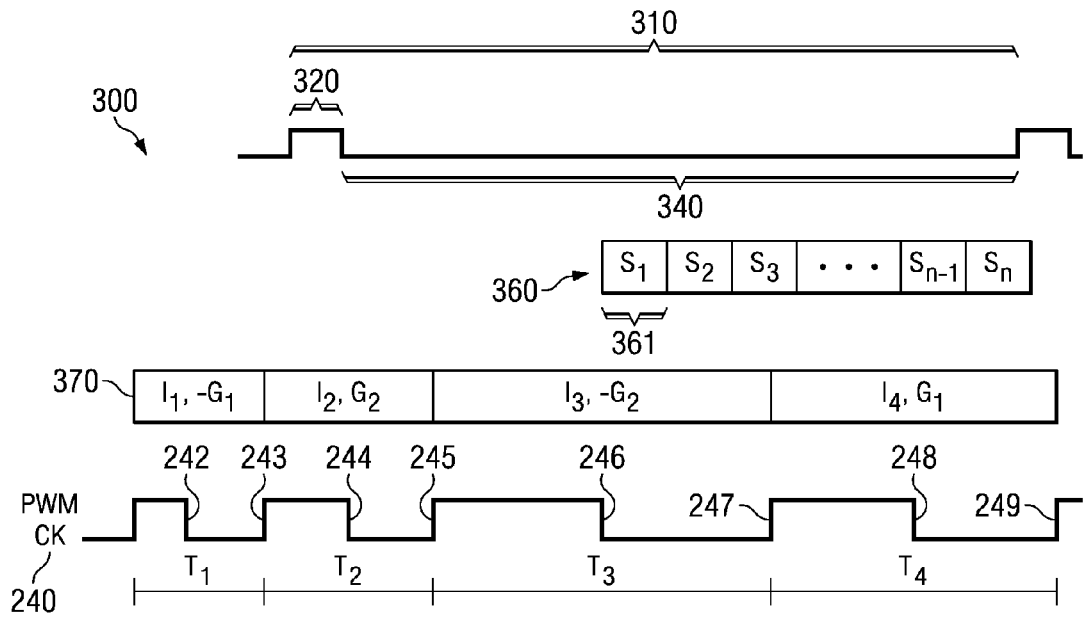
FIG. 3 shows a timing diagram associated with the temperature measurement system of FIG. 2 where a pulse width modulated clock is used to drive the sampling process.

Pulse width modulated clock 240 is generated by pulse width clock modulator 230 based on a clock 220 from an oscillator 210. Turning to FIG. 3, a timing diagram 300 depicts an exemplary operation of temperature measurement system 200 over an operational period 310. As shown, during an operational period 310, temperature calculation system 250 is initialized during an initialization period 320. After initialization, a number of samples 360 are taken during a sampling period 340. Each sample may include excitation of the sampled transistor using two or more different excitation currents.

As shown, during each sampling period represented by sample 361, transistor 260 is excited using four distinct excitation currents: $I_1$, $I_2$, $I_3$ and $I_4$. Thus, as shown, there are four distinct sample periods each tailored to the settling time required when the aforementioned excitation currents are respectively applied to the transistor. The first sample period ($T_1$) includes excitation at a current $I_1$, the second sample period ($T_2$) includes excitation at a current $I_2$, the third sample period ($T_3$) includes excitation at a current I3, and the fourth sample period ($T_4$) includes excitation at a current $I_4$. In one particular embodiment of the present invention, current $I_1$ is one hundred microamps and period $T_1$ is twenty-three microseconds; current $I_2$ is fifty microamps and period $T_2$ is thirty microseconds; current $I_3$ is five microamps and period $T_3$ is sixty microseconds; and current $I_4$ is ten microamps and period $T_4$ is forty microseconds.

It should be noted that while four distinct periods are shown, various embodiments of the present invention may provide two or three distinct periods. Other embodiments of the present invention may provide five or more distinct periods. Based on the disclosure provided herein, one of ordinary skill in the art will recognize an appropriate number of periods for a particular design, and an appropriate duration for each of the periods. Further, it should be noted that while the depicted example shows four distinct periods, one or more of the periods may be the same duration as one or more of the other periods depending upon the particular implementation.

Pulse width modulated clock 240 is tailored to the distinct periods (i.e., $T_1$, $T_2$, $T_3$ and $T_4$) selected to obtain samples 360. In particular, pulse width modulated clock 240 makes one transition causing a sample of the base-emitter voltage of transistor 260 to be taken, and another transition causing an integration of the sampled charge. In particular, during period $T_1$ a negative transition 242 causes a sample of the base-emitter voltage corresponding to $I_1$ to be taken and positive transition 243 causes an integration of the sampled charge. During period $T_2$ a negative transition 244 causes a sample of the base-emitter voltage corresponding to $I_2$ to be taken and positive transition 245 causes an integration of the sampled charge. During period $T_3$ a negative transition 246 causes a sample of the base-emitter voltage corresponding to $I_3$ to be taken and positive transition 247 causes an integration of the sampled charge. During period $T_4$ a negative transition 248 causes a sample of the base-emitter voltage corresponding to $I_4$ to be taken and positive transition 249 causes an integration of the sampled charge. This process is repeated a number of times until a desired temperature resolution is achieved. The result of the sampling is a differential base-emitter voltage that may be used to calculate temperature in accordance with the equations set forth above in relation to FIG. 2.

Figure 4:
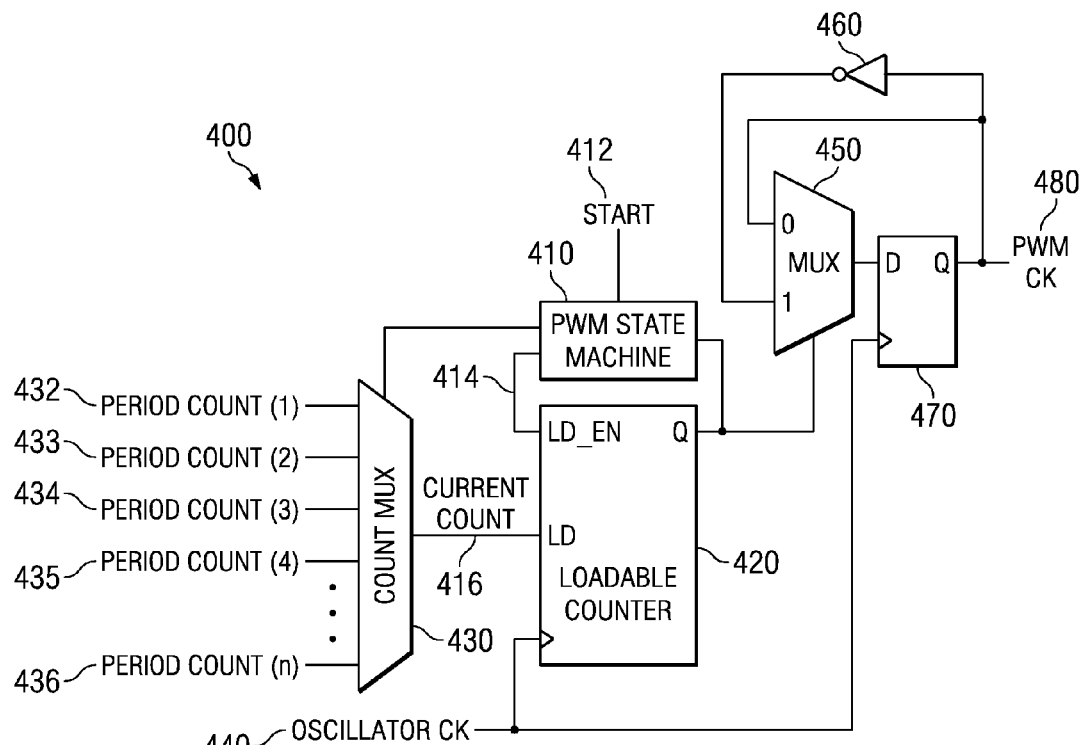
FIG. 4 shows an exemplary pulse width modulated clock circuit that may be used in accordance with various embodiments of the present invention.

Turning to FIG. 4, an exemplary pulse width modulated clock circuit 400 that may be used in accordance with various embodiments of the present invention is shown. Pulse width modulated circuit 400 includes a state machine 410 that, upon assertion of a start signal 412, begins sequencing through selection of period counts 432, 433, 434, 435, 436 via a count multiplexer 430. Each time a new period count is selected, a count load signal 414 is asserted causing the newly selected period count (i.e., a current count 416) to be loaded into a loadable counter 420. Once the selected period count is loaded into loadable counter 420, loadable counter 420 counts down upon each positive edge of an oscillator clock 440. Once the output of loadable counter 420 is zero, state machine 410 sequences to the next state and in so doing selects the next one of period counts 432, 433, 434, 435, 436 used to control the length of the next period. In addition, the newly selected period count is loaded into loadable counter 420.

In addition, once the output of loadable counter 420 is zero, the state of an output pulse width modulated clock 480 is toggled. In particular, an inverted version of pulse width modulated clock 480 (i.e., pulse width modulated clock 480 passing through an inverter 460) is selected via a multiplexer 450. The inverted version of pulse width modulated clock 480 is loaded into a register 470 that drives pulse width modulated clock 480 upon a positive edge of oscillator clock 440. As discussed above, on the next cycle of oscillator clock 440 a non-zero value is loaded into loadable counter 420. Because of this, the non-inverted version of pulse width modulated clock 480 is selected via multiplexer 450 and continually loaded into register 470 upon assertion of oscillator clock 440.

Using pulse width modulated clock circuit 400, pulse width modulated clock 240 may be created such that it is tailored to sampling periods needed to sample base-emitter voltages of transistor 260 for different excitation currents and/or sampling gains. As an example, assume oscillator clock 440 is a two megahertz clock and the following four sampling periods are desired: twenty-three microseconds ($T_1$), thirty microseconds ($T_2$), sixty microseconds ($T_3$), and forty microseconds ($T_4$). In this case, the following four period counts are utilized: twenty-three, thirty, sixty, and forty. In operation, start input 412 is asserted high causing state machine 410 to assume an initial state which results in loading period count 432 (a count of twenty-three) into loadable counter 420. After twenty-three cycles of oscillator clock 440 (i.e., 11.5 microseconds) the output of loadable counter 420 is a zero causing pulse width modulated clock 480 to switch to an assertion level opposite that of its previous assertion. Where it is assumed that pulse width modulated clock is initially at a logic '1' assertion state, the aforementioned switch corresponds to transition 242 of FIG. 3. At the same time, the state of state machine 410 is incremented resulting in the same period count 432 to load into loadable counter 420. After twenty-three clock cycles, the output of loadable counter 420 is again zero causing pulse width modulated clock 480 to switch to an assertion level opposite that of its previous assertion. Again, where it is assumed that pulse width modulated clock is initially at a logic '1' assertion state, the aforementioned switch corresponds to transition 243 of FIG. 3.

At the same time, the state of state machine 410 is incremented resulting in the next period count 433 (i.e., thirty) to load into loadable counter 420. After thirty cycles of oscillator clock 440 (i.e., 15 microseconds), the output of loadable counter 420 is again zero causing pulse width modulated clock 480 to switch to an assertion level opposite that of its previous assertion. Again, where it is assumed that pulse width modulated clock is initially at a logic '1' assertion state, the aforementioned switch corresponds to transition 244 of FIG. 3. The state of state machine 410 is incremented resulting in the same period count 433 to load into loadable counter 420. After thirty clock cycles, the output of loadable counter 420 is again zero causing pulse width modulated clock 480 to switch to an assertion level opposite that of its previous assertion. Again, where it is assumed that pulse width modulated clock is initially at a logic '1' assertion state, the aforementioned switch corresponds to transition 244 of FIG. 3. This process is repeated to achieve the subsequent sixty and forty microsecond periods.

It should be noted that pulse width modulated clock circuit 400 is exemplary of various circuits that may be implemented in accordance with one or more embodiments of the present invention for creating a synchronizing clock that is tailored to a number of desired sampling periods. Based on the disclosure provided herein, one of ordinary skill in the art will recognize a variety of other circuits that may be used in relation to one or more embodiments of the present invention for creating a synchronizing clock tailored to a desired length of two or more sampling periods.

Figure 5:
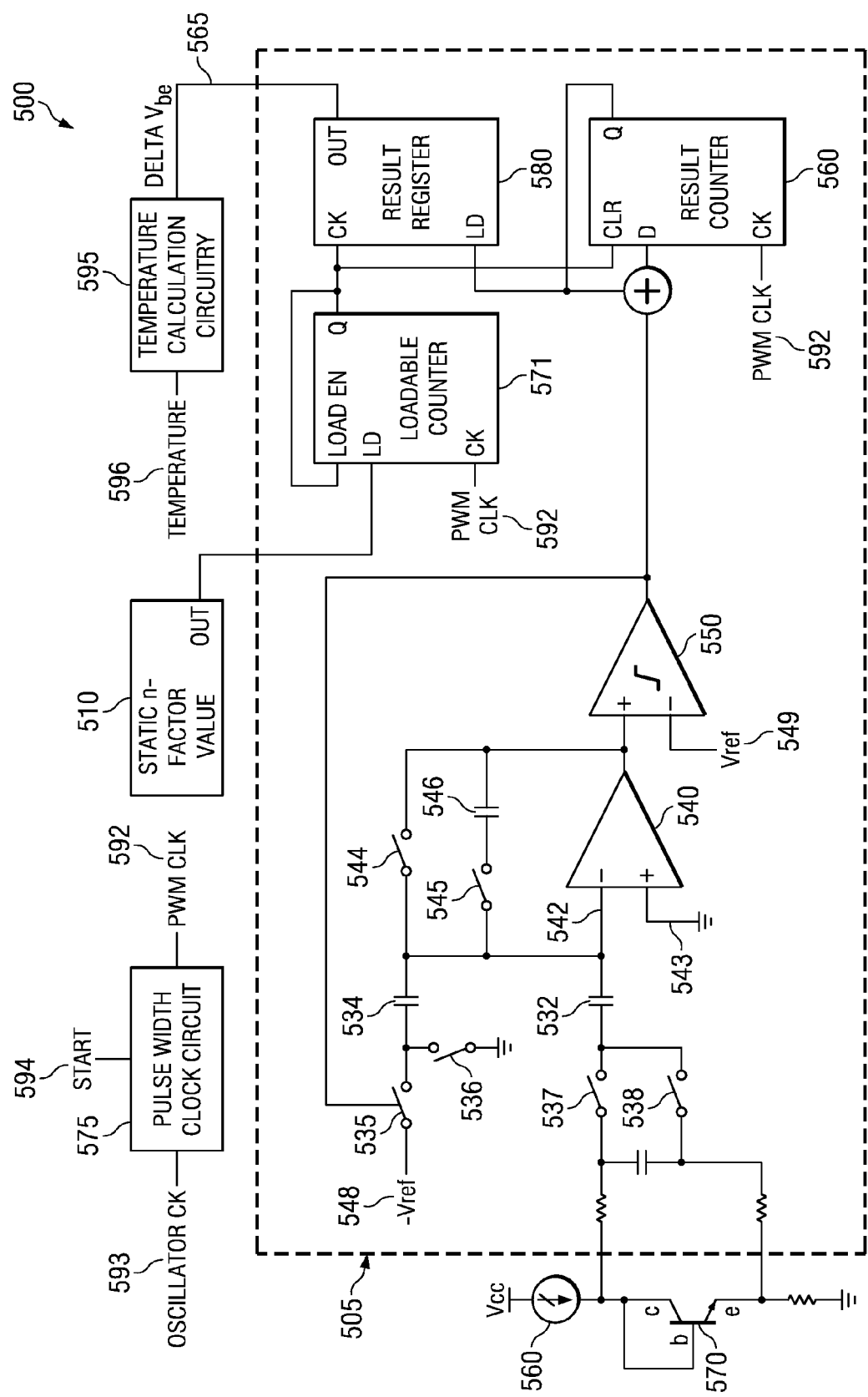
FIG. 5 is a temperature measurement circuit including a pulse width modulated clock in accordance with particular embodiments of the present invention.

Turning to FIG. 5, one implementation of a temperature measurement circuit 500 is depicted with a pulse width modulation circuit 575 providing a synchronizing pulse width modulation clock 592 in accordance with one or more embodiments of the present invention. Temperature measurement circuit 500 includes a static n-factor value 510, a temperature calculation circuit 595, pulse width clock circuit 575, and a first order integrating analog to digital converter 505. In addition, temperature measurement circuit 500 includes a transistor 570 that is diode connected and used as a temperature sensor. It should be noted that while the figure shows an NPN transistor, that other circuits in accordance with one or more embodiments of the present invention may utilize a PNP transistor. The collector and the base of transistor 570 are electrically coupled to a variable current source 560. Further, the base of transistor 570 is electrically coupled to an input of analog to digital converter 505 (i.e., a negative input 542 of an operational amplifier 540 via a switch 537 and an input sampling capacitor 532), and the emitter of transistor 570 is electrically coupled to the same ground as analog to digital converter 505.

Pulse width clock circuit 575 provides pulse width modulated clock 592 that is synchronized by an oscillator clock 593 and sequenced based on a start input 594. Pulse width modulated clock 592 includes a variable period that is tailored to periods used to sample base-emitter voltages of transistor 570. In particular, transistor 570 may be excited by different currents provided via variable current source 560. The desired sampling period may be different for each excitation current. In such a case, pulse width clock circuit 575 provides pulse width modulated clock 592 with a period tailored to one excitation current followed by another period tailored to another excitation current. Pulse width modulated clock 592 may used to drive circuitry of analog to digital converter 505 and other digital circuitry associated with temperature measurement circuit 500. Such other circuitry may include, but is not limited to, registers, I/O buffers, calculation circuitry and control circuitry. Based on the disclosure provided herein, one of ordinary skill in the art will recognize a myriad of other circuitry that may be used in relation to analog to digital converter 505 and/or temperature measurement circuit 500. As such, the aforementioned circuitry uses a variable period clock tailored to bandwidth limiting operations (i.e., base-emitter voltage sampling). This results in elimination of a number of unnecessary clock cycles, and the corresponding power savings and noise reduction. Pulse width clock circuit 575 may be implemented, for example, consistent with pulse width modulated clock circuit 400 discussed above in relation to FIG. 4. Based on the disclosure provided herein, one of ordinary skill in the art will recognize a variety of implementations of pulse width clock circuit 575 that may be used in accordance with different embodiments of the present invention.

Analog to digital converter 505 includes a loadable counter 571 that is synchronized to pulse width modulated clock 592; a result counter 560 that is synchronized to pulse width modulated clock 592; an operational amplifier 540; a comparator 550; switches 535, 536, 537, 538, 544 and 545 that are synchronized to pulse width modulated clock 592; capacitors 532, 534 and 546; a voltage reference 549 and an inverted version of the aforementioned voltage reference 548; and result register 580. It should be noted that the inverted version of the voltage reference may be generated in any number of ways including, but limited to, applying a negative reference voltage, using a positive reference voltage and a defined sampling sequence, or the like. In particular, inverted voltage reference 535 is electrically coupled to a reference sample capacitor 534 via a switch 535. Reference sample capacitor 534 is also electrically coupled to ground via a switch 536, and to negative input 542 of operational amplifier 540. The base and collector of transistor 570 are electrically coupled to negative input 542 of operational amplifier 540 via a switch 537 and an input sample capacitor 532. Negative input 542 of operational amplifier 540 is also electrically coupled to ground via a switch 538. A positive input 543 of operational amplifier 540 is electrically coupled to ground. A switch 544 electrically couples the output of operational amplifier 540 to negative input 542, and a switch 545 and a feedback capacitor 546 electrically couples the output of operational amplifier 540 to negative input 542.

The output of operational amplifier 540 is also electrically coupled to an input of comparator 550. The other input of comparator 550 is electrically coupled to voltage reference 549. The output of comparator 550 is provided to result counter 560, and as a feedback to control switch 535 and switch 536. Result counter 560 counts up synchronously each time the output of comparator 550 is a logic '1' (i.e., each time the sample value is greater than reference voltage 549). The number of samples that are counted is equivalent to static n-factor value 510 as indicated by the value at the output of loadable counter 571. Once the output value of loadable counter 571 is a logic '0', the output value of result counter 560 is stored to result register 580 and result counter 560 is reset. The output (i.e., Delta $V_{be}$ 565) of result register 580 is provided to a temperature calculation circuit 595. The value of Delta $V_{be}$ 565 represents the difference between two or more different base-emitter voltages of transistor 570. The number of samples taken before a result is produced corresponds to static n-factor value 510. In some embodiments of the present invention, the gain of analog to digital converter 505 coupled with static n-factor value 510 corresponds to an n-factor value of 1.008. In some embodiments of the present invention, static n-factor value 510 is replaced with a programmable register. In such cases, the n-factor value is programmable (i.e., the number of samples taken before producing a result is programmable in such a way that it effectively results in use of a different n-factor value).

In operation, variable current source 560 is set to apply a first current to transistor 570 after which the base-emitter voltage ($V_{be}$) is detected. In particular, after applying the first current from variable current source 560, switch 537 and switch 544 are closed allowing input sample capacitor 532 to charge to the value on the base of transistor 570. This may be done on one edge (either positive or negative edge) of pulse width modulated clock 592. The charge from input sample capacitor 532 is then transferred to feedback capacitor 546 by opening switch 537 and switch 544, and closing switch 545 and switch 538. This is done on the next edge (either negative or positive) of pulse width modulated clock 592. It should be noted that in other embodiments of the present invention that the aforementioned processes of sampling and charge transfer may be done on successive positive edges of pulse width modulated clock 592 or successive negative edges. In such a case, the clock rate may be approximately double what it would be where both positive and negative clock edges are used.

Transferring the charge from input sample capacitor to feedback capacitor 546 results in an output from operational amplifier 540 at the input of comparator 550. Where the gain of operational amplifier 540 is unity, the output is approximately equal to the voltage at the base of transistor 570. The output of operational amplifier 550 is compared with voltage reference 549. Where the result is a logic '0', result counter 560 is not incremented. In the next pass, the voltage at the base of transistor 570 is again sampled by closing switch 537 and switch 544. Once charging is complete, charge is transferred from input sample capacitor 532 to feedback capacitor 546 by closing switch 538 and switch 545. This results in a value of approximately double the voltage at the base of transistor 570 at the output of operational amplifier 540. Again, where the result is a logic '0', result counter 560 is not incremented and substantially the same process is repeated until the result of a logic '1' is achieved.

Alternatively, on any pass where the result of the comparison is a logic '1', result counter 560 is incremented. Further, where the result is a logic '1', the negative version of the voltage reference 548 is sampled along with the voltage at the base of transistor 570 on the next pass. This is done by closing switch 535, switch 537 and switch 544. This causes charge to build up on reference sample capacitor 534 representing the negative reference voltage, and charge to build up on input sample capacitor 532 representing the voltage at the base of transistor 570. The charge from both of the aforementioned capacitors is transferred to feedback capacitor 546 by closing switch 536, switch 538 and switch 545. By continually re-sampling the voltage at the base of transistor 570 and sampling the negative voltage reference any time a logic '1' is noted, the following residue will remain for a counter value of X and a number of iterations N:

Residue=$NV_{in}$-$XV_{ref}$, where $V_{in}$ is the difference between two or more base-emitter voltages. The digital value representing the voltage at the base of transistor 570 is that maintained on result counter 560 at the end of the process. The process is continued for the number of samples loaded into loadable counter 571 (i.e., corrected n-factor 323).

During the sampling period, variable current source 560 is initially set to apply a first current to transistor 570 and subsequently to apply a second current. The first and second currents result in respective base-emitter voltages. By repeatedly applying two different currents to transistor 570, an integration of the difference between the respective base-emitter voltages is achieved in result counter 560. The output of result counter 560 is ultimately registered in result register 580 as Delta $V_{be}$ 565. This output is used to calculate temperature based on the following equation:

$\Delta V_{be, adjusted} = n*kT/q*ln(I_2/I_1)$.

It should be noted that analog to digital converter 505 may be implemented as another type of analog to digital converter. For example, analog to digital converter 505 may be implemented as a fully differential analog to digital converter where the base of transistor is electrically coupled to one differential input of the differential analog to digital converter, and the emitter of transistor 570 is electrically coupled to the other differential input of the differential analog to digital converter. Based on the disclosure provided herein, one of ordinary skill in the art will recognize other types of analog to digital converters that may be used in relation to various embodiments of the present invention.

Further, it should be noted that while the aforementioned embodiments are described with particular reference to remote junction temperature sensing, the approaches, methods and circuits described herein can be applied to producing and utilizing a PWM clocking scheme in a number of different circumstances. For example, various embodiments of the present invention may be applicable to other excitation scenarios where different settling times are incurred after an initial excitation.

In conclusion, the present invention provides novel systems, devices, methods for temperature measurement. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. An apparatus comprising:
   a variable current source that is operable to provide a first current and a second current;
   a transistor that is electrically coupled to the variable current source, wherein a first base-emitter voltage occurs when the first current is applied to the transistor, and wherein a second base-emitter voltage occurs when the second current is applied to the transistor, wherein a first sample period is associated with the first base-emitter voltage, and wherein a second sample period is associated with the second base-emitter voltage;
   a pulse width modulation circuit that provides a pulse width modulated clock with a first period corresponding to the first sample period and a second period corresponding to the second sample period; and
   a temperature measurement circuit that is coupled to the transistor and to the pulse width modulation circuit, wherein the temperature measurement circuit receives the pulse width modulated clock.

2. The apparatus of claim 1, wherein the pulse width modulated clock includes a repeating pattern of a first clock cycle succeeded by a second clock cycle, and the second clock cycle succeeded by the first clock cycle; and wherein the first clock cycle exhibits the first period and the second clock cycle exhibits the second period.

3. The apparatus of claim 1, wherein the first sample period corresponds to a settling time of the first base-emitter voltage after application of the first current.

4. The apparatus of claim 3, wherein the second sample period corresponds to a settling time of the second base-emitter voltage after application of the second current.

5. The apparatus of claim 4, wherein the first sample period is greater than the second sample period.

6. The apparatus of claim 1, wherein the apparatus further includes an originating clock, wherein the originating clock includes a substantially constant period, and wherein the pulse width modulated clock is synchronized to the originating clock by the pulse width modulation circuit.

7. The apparatus of claim 1, wherein the variable current source is further operable to provide a third current and a fourth current; wherein a third base-emitter voltage occurs when the third current is applied to the transistor, wherein a fourth base-emitter voltage occurs when the fourth current is applied to the transistor, wherein a third sample period is associated with the third base-emitter voltage, and wherein a fourth sample period is associated with the fourth base-emitter voltage; and wherein the pulse width modulation circuit provides a pulse width modulated clock with the first period associated with the first sample period, the second period associated with the second sample period, a third period associated with the third sample period, and a fourth period associated with the fourth sample period.

8. The apparatus of claim 7, wherein the pulse width modulated clock includes a repeating pattern of a first clock cycle succeeded by a second clock cycle, the second clock cycle succeeded by a third clock cycle, the third clock cycle succeeded by a fourth clock cycle, and the fourth clock cycle succeeded by the first clock cycle; and wherein the first clock cycle exhibits the first period, the second clock cycle exhibits the second period, the third clock cycle exhibits the third period, and the fourth clock cycle exhibits the fourth period.

9. The apparatus of claim 1, wherein the temperature measurement circuit further comprises:
   an analog to digital converter (ADC) that is coupled to the transistor; and
   a temperature calculation circuit that is coupled to the ADC.

10. The apparatus of claim 9, wherein the ADC further comprises a result counter that tabulates a delta base-emitter voltage value, and wherein the result counter is synchronized to the pulse width modulated clock.

11. The apparatus of claim 9, wherein the ADC further comprises a sample counter, wherein the number of samples processed before a result is produced is governed by the sample counter, and wherein the sample counter is synchronized to the pulse width modulated clock.

12. The apparatus of claim 9, wherein the temperature calculation circuit is synchronized to the pulse width modulated clock, and wherein the temperature measurement circuit provides a temperature output based at least in part on the delta base-emitter voltage.

13. The apparatus of claim 12, wherein the temperature measurement circuit associated with other digital circuitry, and wherein the other digital circuitry is synchronized to the pulse width modulated clock.

14. An apparatus comprising;
   a pulse width modulator that generates a pulse width modulated clock having a plurality of periods;
   a current source having a plurality of currents;
   a transistor that is coupled to the current source so that the current source applies each of the currents to the transistor during an at least one of a plurality of sample period, wherein each sample period is associated with one of the period of the pulse width modulated clock, and where at least one of a plurality of base-emitter voltages occurs when each of the currents is applied to the transistor; and
   a temperature measurement circuit that is coupled to the transistor and the pulse width modulation circuit, wherein the temperature measurement circuit receives the pulse width modulated clock.

15. The apparatus of claim 14, wherein each sample period corresponds to a settling time of its corresponding base-emitter voltage after application of its corresponding current.

16. The apparatus of claim 14, wherein the pulse width modulator includes:
   a first multiplexer that receives a plurality of count periods;
   a counter that is coupled to the first multiplexer and that is coupled to an oscillator;
   a state machine that is coupled to the counter and the first multiplexer;
   a second multiplexer that is coupled to the counter; and
   a register that is coupled to the second multiplexer.

17. The apparatus of claim 14, wherein the temperature measurement circuit further comprises:
   an ADC that is coupled to the transistor and to the pulse width modulator; and
   a temperature calculation circuit that is coupled to the ADC.

18. An apparatus comprising:

an oscillator;

a pulse width modulator that generates a pulse width modulated clock having a plurality of periods, wherein the pulse width modulator includes:
- a first multiplexer that receives a plurality of count periods;
- a counter that is coupled to the first multiplexer and that is coupled to the oscillator;
- a state machine that is coupled to the counter and the first multiplexer;
- a second multiplexer that is coupled to the counter; and
- a register that is coupled to the second multiplexer;

a current source having a plurality of currents;

a transistor that is coupled to the current source so that the current source applies each of the currents to the transistor during an at least one of a plurality of sample period, wherein each sample period is associated with one of the period of the pulse width modulated clock, and where at least one of a plurality of base-emitter voltages occurs when each of the currents is applied to the transistor; and a temperature measurement circuit including:
- an ADC that is coupled to the transistor and to the pulse width modulator; and
- a temperature calculation circuit that is coupled to the ADC.

19. The apparatus of claim 18, wherein each sample period corresponds to a settling time of its corresponding base-emitter voltage after application of its corresponding current.

* * * * *